US012609495B2

(12) United States Patent
Hsu et al.

(10) Patent No.: US 12,609,495 B2
(45) Date of Patent: Apr. 21, 2026

(54) ELECTRICAL CONNECTOR, ADAPTER AND TEST DEVICE WITH SMOOTH IMPEDANCE TRANSITION

(71) Applicant: Luxshare Precision Industry Company Limited, Shenzhen (CN)

(72) Inventors: Chien-Yu Hsu, Shenzhen (CN); Ruey-Ting Liao, Shenzhen (CN); Shih-Tung Lin, Shenzhen (CN); Chi-Wei Lin, Shenzhen (CN)

(73) Assignee: LUXSHARE PRECISION INDUSTRY COMPANY LIMITED, Shenzhen (CN)

( * ) Notice: Subject to any disclaimer, the term of this patent is extended or adjusted under 35 U.S.C. 154(b) by 220 days.

(21) Appl. No.: 18/519,711

(22) Filed: Nov. 27, 2023

(65) Prior Publication Data

US 2024/0310429 A1     Sep. 19, 2024

(30) Foreign Application Priority Data

Mar. 13, 2023   (CN) .......................... 202310261220.9

(51) Int. Cl.
*H01R 24/50*          (2011.01)
*G01R 31/28*          (2006.01)
(Continued)

(52) U.S. Cl.
CPC ......... *H01R 24/50* (2013.01); *G01R 31/2808* (2013.01); *H01R 24/44* (2013.01); *H01R 24/542* (2013.01); *H01R 12/71* (2013.01)

(58) Field of Classification Search
CPC ........ H01R 24/40; H01R 24/50; H01R 24/44; H01R 12/712; G01R 31/2808
(Continued)

(56)          References Cited

U.S. PATENT DOCUMENTS 4,917,630 A * 4/1990 Hubbard ................ H01R 24/52
                                                         439/675
5,055,068 A * 10/1991 Machura ................ H01R 24/50
                                                         439/581

(Continued)

FOREIGN PATENT DOCUMENTS

CN         111641084 A      9/2020
TW         201223025 A1     6/2012

*Primary Examiner* — Marcus E Harcum
(74) *Attorney, Agent, or Firm* — Birch, Stewart, Kolasch & Birch, LLP

(57)          ABSTRACT

An electrical connector includes an outer shell, an insulating element, and a central conductive terminal. The outer shell includes a mounting hole. The insulating element is installed in the mounting hole. The central conductive terminal includes a first fitting portion, a second fitting portion and an intermediate portion. When a signal is transmitted in the first fitting portion, it encounters an impedance having a first impedance value. When the signal is transmitted in the second fitting portion, it encounters an impedance having a second impedance value. The intermediate portion includes an impedance transition area. When the signal is transmitted in the impedance transition area, it encounters an impedance having a gradually changing third impedance value. The first impedance value, the third impedance value and the second impedance value generally have a smooth transition. An adapter and a test device having the electrical connector are disclosed.

19 Claims, 13 Drawing Sheets

(51) Int. Cl.
  *H01R 24/44* (2011.01)
  *H01R 24/54* (2011.01)
  *H01R 12/71* (2011.01)

(58) Field of Classification Search
  USPC ................................................. 439/578, 581
  See application file for complete search history.

(56) References Cited

U.S. PATENT DOCUMENTS

| | | | | |
|---|---|---|---|---|
| 5,070,314 A * | 12/1991 | Decker | ................... | H01P 1/045 |
| | | | | 333/260 |
| 5,563,562 A * | 10/1996 | Szwec | ................... | H01R 24/44 |
| | | | | 333/260 |
| 5,577,269 A * | 11/1996 | Ludewig | ............. | H04B 1/3833 |
| | | | | 455/90.3 |
| 6,816,039 B1 * | 11/2004 | Taylor | ....................... | H01P 3/06 |
| | | | | 439/578 |
| 6,933,713 B2 * | 8/2005 | Cannon | ............... | H01R 13/625 |
| | | | | 439/578 |
| 6,992,544 B2 * | 1/2006 | Barnes | ................... | H01P 5/085 |
| | | | | 333/260 |
| 7,042,318 B2 * | 5/2006 | Barnes | ................... | H01P 5/085 |
| | | | | 333/260 |
| 7,471,168 B2 * | 12/2008 | Lee | ........................ | H01P 1/045 |
| | | | | 439/63 |
| 7,575,474 B1 * | 8/2009 | Dodson | ................ | H01R 12/716 |
| | | | | 439/581 |
| 7,934,954 B1 * | 5/2011 | Chawgo | ................ | H01R 24/56 |
| | | | | 439/585 |
| 8,475,204 B2 * | 7/2013 | Blasick | ................. | H01R 24/44 |
| | | | | 439/578 |
| 8,618,944 B2 * | 12/2013 | Montena | ............... | H01R 24/44 |
| | | | | 439/578 |
| 8,814,592 B2 * | 8/2014 | Potet | ...................... | H01R 24/44 |
| | | | | 439/578 |
| 9,379,498 B2 * | 6/2016 | Kaneko | ................. | H01R 24/44 |
| 10,170,869 B2 * | 1/2019 | Gailus | ............... | H01R 13/6585 |
| 2005/0037664 A1 * | 2/2005 | Weidner | ................... | H01R 9/05 |
| | | | | 439/581 |
| 2006/0128215 A1 | 6/2006 | Lee et al. | | |
| 2010/0184326 A1 * | 7/2010 | Montena | ............... | H01R 24/44 |
| | | | | 29/729 |
| 2013/0157503 A1 * | 6/2013 | Sykes | ................... | H01R 24/44 |
| | | | | 439/578 |
| 2013/0157505 A1 * | 6/2013 | Sykes | ..................... | H01R 9/05 |
| | | | | 439/578 |
| 2014/0206221 A1 * | 7/2014 | Morley | ................... | H01R 9/05 |
| | | | | 439/271 |
| 2015/0222061 A1 | 8/2015 | Kaneko et al. | | |
| 2023/0163537 A1 * | 5/2023 | Burris | ................... | H01R 24/44 |
| | | | | 439/578 |

* cited by examiner 300          200          400

ELECTRICAL CONNECTOR, ADAPTER AND TEST DEVICE WITH SMOOTH IMPEDANCE TRANSITION

CROSS-REFERENCE TO RELATED APPLICATION

This patent application claims priority of a Chinese Patent Application No. 202310261220.9, filed on Mar. 13, 2023 and titled "ELECTRICAL CONNECTOR, ADAPTER AND TEST DEVICE", the entire content of which is incorporated herein by reference.

TECHNICAL FIELD

The present disclosure relates to an electrical connector, an adapter and a test device, which belong to a technical field of electrical interconnection.

BACKGROUND

In order to determine whether the performance of a connector meets the requirements, the connector needs to be tested. A test device in the related art generally includes a circuit board, an electrical connector, and a vector network analyzer. Normally, the vector network analyzer is electrically connected to the circuit board through the electrical connector and a cable. A port for mating with the connector to be tested is provided on the circuit board.

In the related art, since the impedance of the connector to be tested, the impedance of conductive paths on the circuit board, and the impedance of the cable are consistent, therefore the electrical connector is also required to keep the impedance consistency of signal paths.

However, as the market's requirements for transmission speed continue to increase, the impedance design of components under test (such as a connector or a cable) is getting lower and lower. If the existing related technology is directly used for testing, the signal loss (such as insertion loss and reflection loss) will be caused due to the problem of impedance mismatch, and the higher the frequency, the greater the impact, which is not beneficial to realize the accuracy of testing.

In the related art, the impedance of the circuit board of the test device has been designed to match the component under test. However, since the electrical connector remains unchanged, there will still be an impedance mismatch problem, which cannot be eliminated through calibration.

SUMMARY

An object of the present disclosure is to provide an electrical connector, an adapter and a test device with smooth impedance transition.

In order to achieve the above object, the present disclosure adopts the following technical solution: an electrical connector, including:

an outer shell defining a mounting hole, at least part of the outer shell being a metal shell;

an insulating element installed in the mounting hole, the insulating element defining a through hole extending in an axial direction; and a central conductive terminal inserted into and at least partially extending through the through hole, the central conductive terminal including a first fitting portion, a second fitting portion, and an intermediate portion located between the first fitting portion and the second fitting portion; the central conductive terminal being configured to transmit a signal;

when the signal is transmitted in the first fitting portion, it encounters an impedance having a first impedance value; when the signal is transmitted in the second fitting portion, it encounters an impedance having a second impedance value; the intermediate portion includes an impedance transition area, and when the signal is transmitted in the impedance transition area, it encounters an impedance having a gradually changing third impedance value;

wherein the first impedance value is different from the second impedance value; the first impedance value, the third impedance value and the second impedance value generally have a smooth transition.

In order to achieve the above object, the present disclosure adopts the following technical solution: an adapter, configured to electrically connect a first electrical element with a second electrical element, including an electrical connector, the electrical connector including:

an outer shell defining a mounting hole, at least part of the outer shell being a metal shell;

an insulating element installed in the mounting hole, the insulating element defining a through hole extending in an axial direction; and a central conductive terminal inserted into and at least partially extending through the through hole, the central conductive terminal including a first fitting portion, a second fitting portion, and an intermediate portion located between the first fitting portion and the second fitting portion; the central conductive terminal being configured to transmit a signal;

when the signal is transmitted in the first fitting portion, it encounters an impedance having a first impedance value; when the signal is transmitted in the second fitting portion, it encounters an impedance having a second impedance value; the intermediate portion includes an impedance transition area, and when the signal is transmitted in the impedance transition area, it encounters an impedance having a gradually changing third impedance value;

wherein the first impedance value is different from the second impedance value; the first impedance value, the third impedance value and the second impedance value generally have a smooth transition;

wherein one end of the electrical connector is electrically connected to the first electrical element, and another end of the electrical connector is electrically connected to the second electrical element.

In order to achieve the above object, the present disclosure adopts the following technical solution:

a test device, including:

a circuit board;

an electrical connector electrically connected to the circuit board; and a vector network analyzer electrically connected to the circuit board through the electrical connector;

the electrical connector including:

an outer shell defining a mounting hole, at least part of the outer shell being a metal shell;

an insulating element installed in the mounting hole, the insulating element defining a through hole extending in an axial direction; and a central conductive terminal inserted into and at least partially extending through the through hole, the central conductive terminal including a first fitting portion, a second fitting portion, and an intermediate portion located between the first fitting portion and the second fitting portion; the central conductive terminal being configured to transmit a signal;

when the signal is transmitted in the first fitting portion, it encounters an impedance having a first impedance value; when the signal is transmitted in the second fitting portion, it encounters an impedance having a second impedance value; the intermediate portion includes an impedance transition area, and when the signal is transmitted in the impedance transition area, it encounters an impedance having a gradually changing third impedance value;

wherein the first impedance value is different from the second impedance value; the first impedance value, the third impedance value and the second impedance value generally have a smooth transition;

wherein the circuit board is configured to be electrically connected to a connector to be tested.

Compared with the prior art, the present disclosure is provided with an impedance transition area, and when a signal is transmitted in the impedance transition area, it encounters an impedance with a gradually changing third impedance value, thereby realizing a smooth transition from the first impedance value to the second impedance value.

DETAILED DESCRIPTION

Figure 1:
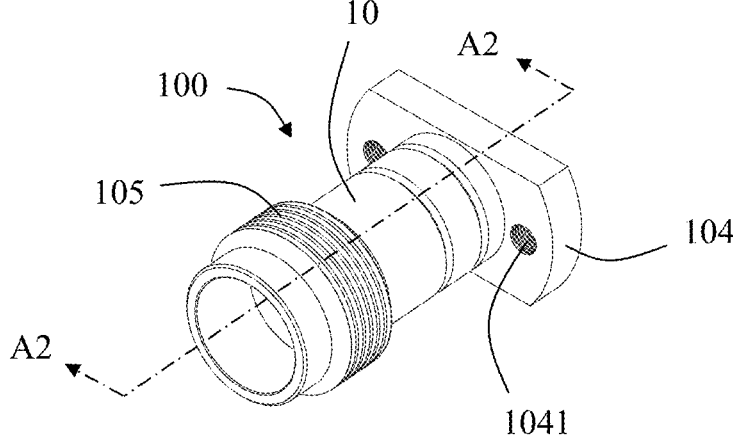
FIG. 1 is a schematic perspective view of an electrical connector in accordance with a first embodiment of the present disclosure.
Figure 2:
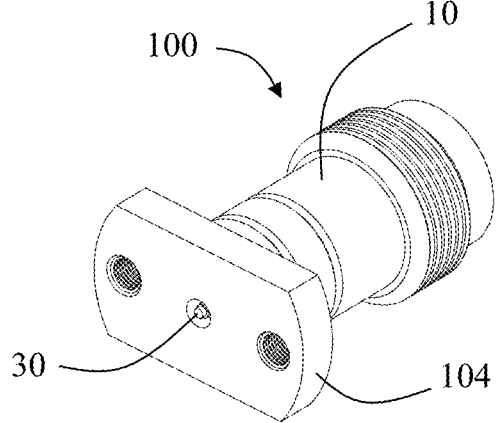
FIG. 2 is a schematic perspective view of FIG. 1 from another angle.
Figure 3:
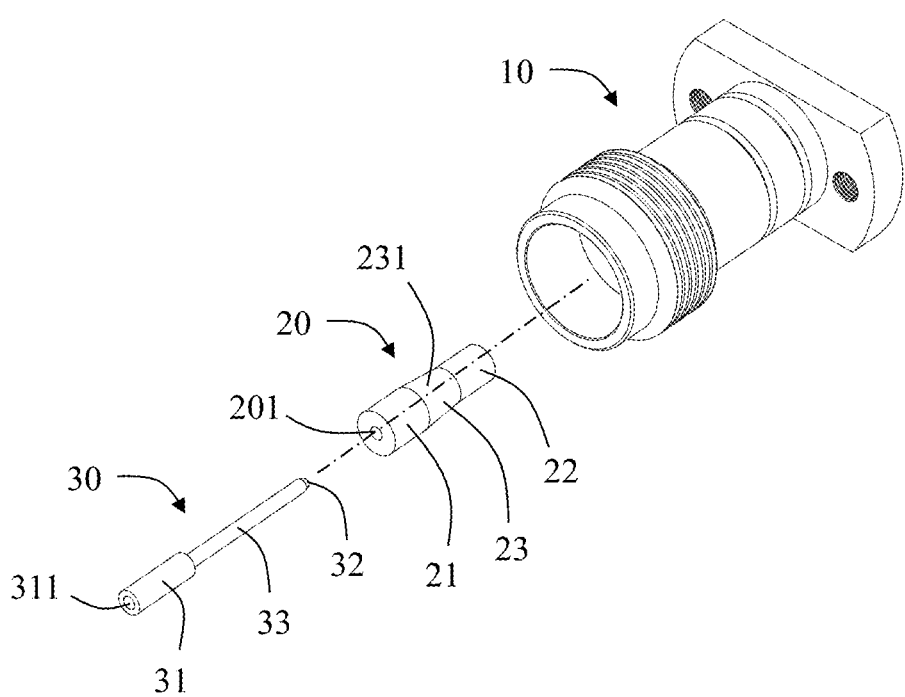
FIG. 3 is a perspective exploded view of FIG. 1.
Figure 4:
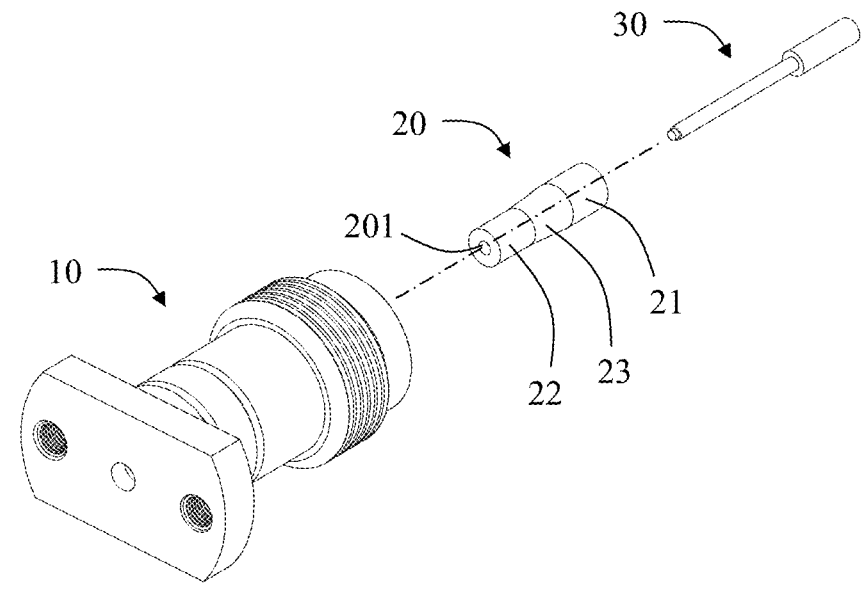
FIG. 4 is a perspective exploded view of FIG. 3 from another angle.
Figure 5:
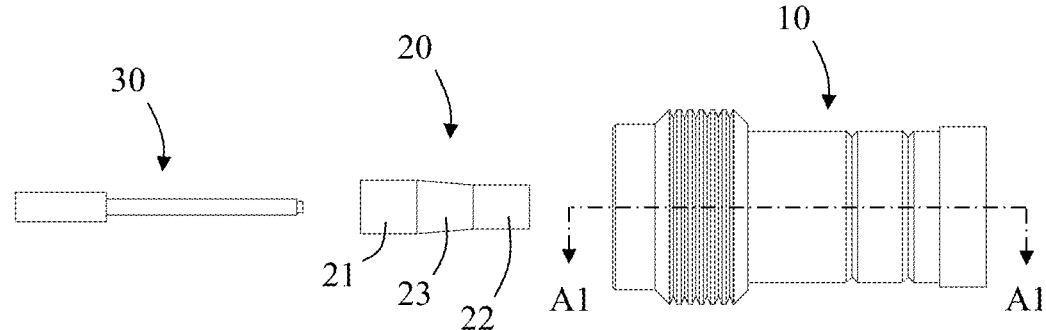
FIG. 5 is a side view of FIG. 4.

Exemplary embodiments will be described in detail here, examples of which are shown in drawings. When referring to the drawings below, unless otherwise indicated, same numerals in different drawings represent the same or similar elements. The examples described in the following exemplary embodiments do not represent all embodiments consistent with this application. Rather, they are merely examples of devices and methods consistent with some aspects of the application as detailed in the appended claims.

The terminology used in this application is only for the purpose of describing particular embodiments, and is not intended to limit this application. The singular forms "a", "said", and "the" used in this application and the appended claims are also intended to include plural forms unless the context clearly indicates other meanings.

It should be understood that the terms "first", "second" and similar words used in the specification and claims of this application do not represent any order, quantity or importance, but are only used to distinguish different components. Similarly, "an" or "a" and other similar words do not mean a quantity limit, but mean that there is at least one; "multiple" or "a plurality of" means two or more than two. Unless otherwise noted, "front", "rear", "lower" and/or "upper" and similar words are for ease of description only and are not limited to one location or one spatial orientation. Similar words such as "include" or "comprise" mean that elements or objects appear before "include" or "comprise" cover elements or objects listed after "include" or "comprise" and their equivalents, and do not exclude other elements or objects. The term "a plurality of" mentioned in the present disclosure includes two or more.

Hereinafter, some embodiments of the present disclosure will be described in detail with reference to the accompanying drawings. In the case of no conflict, the following embodiments and features in the embodiments can be combined with each other.

Referring to FIGS. 1 to 7, the present disclosure discloses an electrical connector 100, which includes an outer shell 10, an insulating element 20 and a central conductive terminal 30. In the illustrated embodiments of the present disclosure, the electrical connector 100 is a coaxial connector. The outer shell 10 includes a mounting hole 101 extending in an axial direction. The insulating element 20 is at least partially installed in the mounting hole 101 along the axial direction. At least part of the outer shell 10 is a metal shell to achieve grounding.

Figure 6:
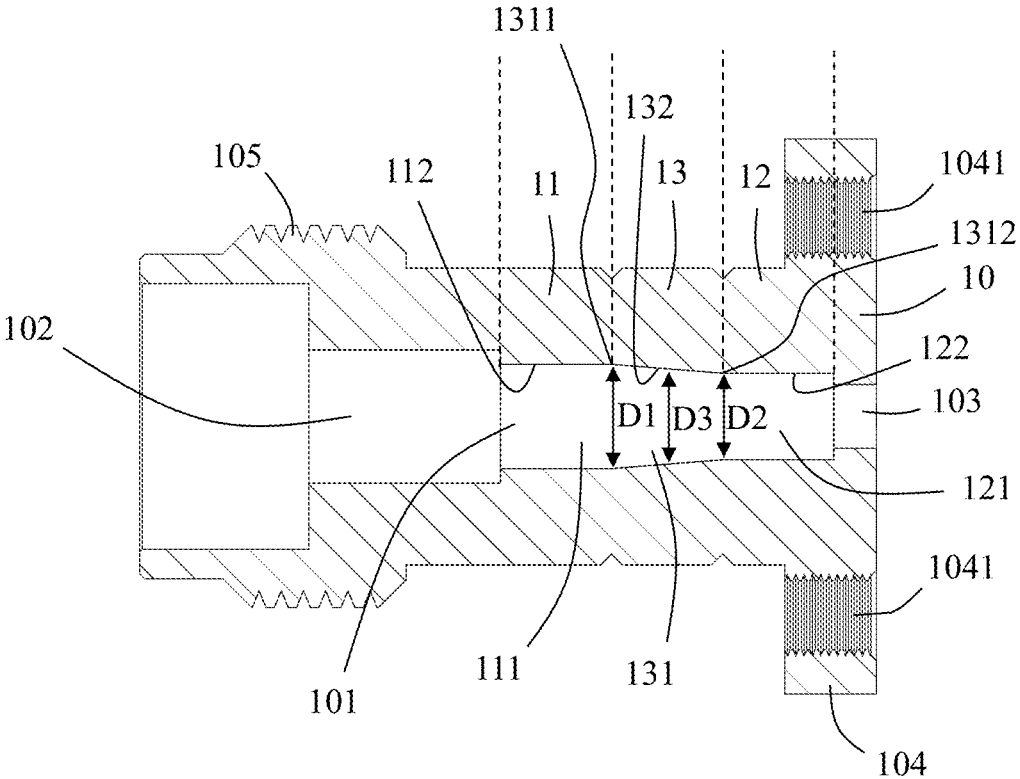
FIG. 6 is a schematic sectional view taken along line A1-A1 in FIG. 5.

Referring to FIG. 6, in the illustrated embodiment of the present disclosure, the outer shell 10 further includes a first accommodating hole 102 and a second accommodating hole 103.

The first accommodating hole 102 and the second accommodating hole 103 are located at two ends of the outer shell 10 along the axial direction, respectively. The mounting hole 101 is located between the first accommodating hole 102 and the second accommodating hole 103 along the axial direction. The mounting hole 101 communicates with the first accommodating hole 102 and the second accommodating hole 103. In the illustrated embodiment of the present disclosure, a diameter of the first accommodating hole 102 is larger than a diameter of a junction of the mounting hole 101 and the first accommodating hole 102. A diameter of the second accommodating hole 103 is smaller than a diameter of a junction of the mounting hole 101 and the second accommodating hole 103.

Besides, the outer shell 10 includes a flange portion 104 which is provided with a plurality of threaded holes 1041. The threaded holes 1041 are configured to cooperate with bolts to install the electrical connector 100 on a corresponding component. The outer shell 10 is further provided with external threads 105 on an outer surface away from the flange portion 104. The external threads 105 are configured to mate with a mating connector.

The outer shell 10 includes a first shell portion 11, a second shell portion 12 and a third shell portion 13. In the first embodiment shown in the present disclosure, the first shell portion 11, the second shell portion 12 and the third shell portion 13 are all metal shells and are integrally formed. The first shell portion 11, the second shell portion 12 and the third shell portion 13 are arranged adjacently and sequentially along the axial direction. The mounting hole 101 extends through the first shell portion 11, the second shell portion 12 and the third shell portion 13 in the axial direction. The first shell portion 11 includes a first mounting hole 111 and a first inner wall surface 112 exposed in the first mounting hole 111. The second shell portion 12 includes a second mounting hole 121 and a second inner wall surface 122 exposed in the second mounting hole 121. The third shell portion 13 includes a central hole 131 and an inner surface 132 exposed in the central hole 131. In the illustrated embodiment of the present disclosure, the first mounting hole 111 is a cylindrical hole, the second mounting hole 121 is a cylindrical hole, the central hole 131 is a tapered hole, and the inner surface 132 is an inner tapered surface. The central hole 131 is able to function as an impedance transition. In the illustrated embodiment of the present disclosure, the mounting hole 101 includes the first mounting hole 111, the central hole 131 and the second mounting hole 121. The first mounting hole 111 communicates with the first accommodating hole 102. The second mounting hole 121 communicates with the second accommodating hole 103.

The first mounting hole 111 communicates with the second mounting hole 121 through the central hole 131. The first mounting hole 111, the central hole 131 and the second mounting hole 121 are coaxially arranged.

In the illustrated embodiment of the present disclosure, the first mounting hole 111 has a first diameter D1, the second mounting hole 121 has a second diameter D2, and the central hole 131 has a gradually changing third diameter D3. The central hole 131 includes a first end portion 1311 adjacent to the first mounting hole 111 and a second end portion 1312 adjacent to the second mounting hole 121. The central hole 131 has a same first diameter D1 at the first end portion 1311 as the first mounting hole 111. The central hole 131 has a same second diameter D2 at the second end portion 1312 as the second mounting hole 121. The third diameter D3 is configured to gradually transition from the first diameter D1 to the second diameter D2. In other words, the inner surface 132 changes continuously from the first end portion 1311 to the second end portion 1312. Preferably, the inner surface 132 changes linearly or smoothly from the first end portion 1311 to the second end portion 1312.

Referring to FIG. 6, in the embodiment shown in the present disclosure, outer surfaces of the first shell portion 11, the second shell portion 12 and the third shell portion 13 are substantially flush. A thickness of the first shell portion 11 along a radial direction is greater than a thickness of the second shell portion 12. Since the inner surface 132 changes continuously from the first end portion 1311 to the second end portion 1312, a thickness of the third shell portion 13 changes continuously from the first end portion 1311 to the second end portion 1312. Preferably, the thickness of the third shell portion 13 changes linearly or in a smooth curve from the first end portion 1311 to the second end portion 1312.

Figure 7:
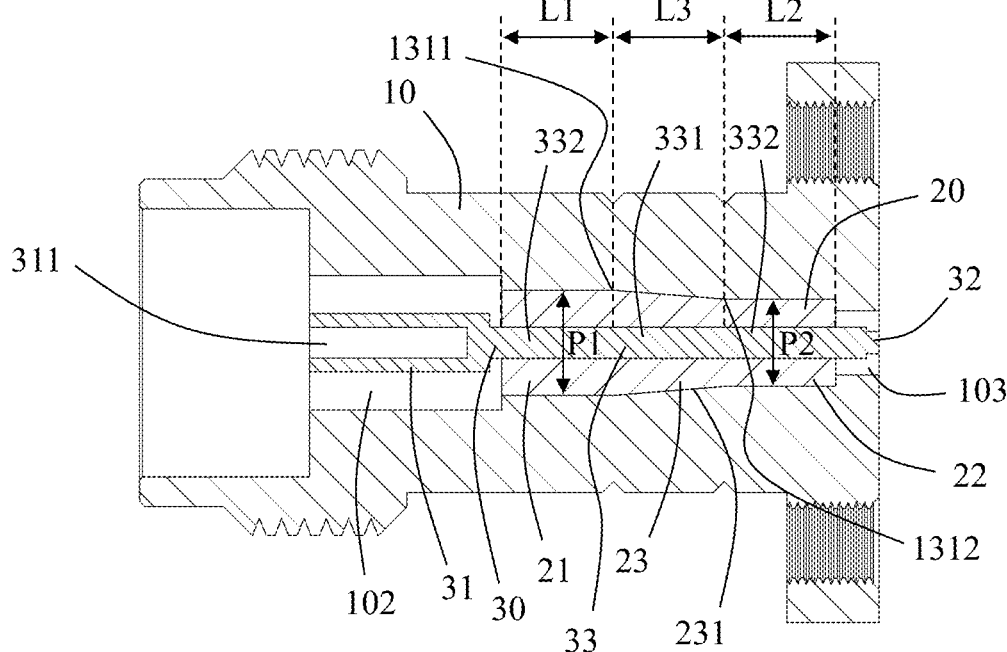
FIG. 7 is a schematic sectional view taken along line A2-A2 in FIG. 1.
Figure 8:
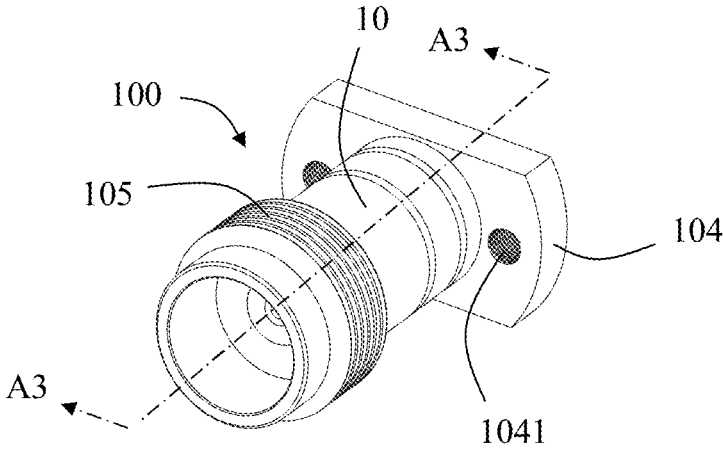
FIG. 8 is a schematic perspective view of an electrical connector in accordance with a second embodiment of the present disclosure.

Referring to FIG. 3 to FIG. 5 and FIG. 7, the insulating element 20 is made of dielectric material. In an embodiment of the present disclosure, the dielectric material is insulating plastic, which is installed in the mounting hole 101. The insulating element 20 includes a through hole 201 extending axially for the central conductive terminal 30 to pass through. In a first embodiment of the present disclosure, the insulating element 20 includes a first cylindrical portion 21, a second cylindrical portion 22, and a cone portion 23 connecting the first cylindrical portion 21 and the second cylindrical portion 22. Referring to FIG. 7, the first cylindrical portion 21 has a first outer diameter P1, and the second cylindrical portion 22 has a second outer diameter P2. An end of the cone portion 23 adjacent to the first cylindrical portion 21 has a same first outer diameter P1 as that of the first cylindrical portion 21. Another end of the cone portion 23 adjacent to the second cylindrical portion 22 has a same second outer diameter P2 as that of the second cylindrical portion 22. The first outer diameter P1 is larger than the second outer diameter P2. The cone portion 23 includes an outer cone surface 231. An outer diameter of the cone portion 23 changes continuously to gradually transition from the first outer diameter P1 to the second outer diameter P2. Preferably, the outer diameter of the cone portion 23 changes linearly or in a smooth curve.

In the illustrated embodiment of the present disclosure, the first cylindrical portion 21 is accommodated and fixed in the first mounting hole 111, the second cylindrical portion 22 is accommodated and fixed in the second mounting hole 121, and the cone portion 23 is accommodated and fixed in the central hole 131.

The central conductive terminal 30 is inserted into and at least partially extends through the through hole 201. The central conductive terminal 30 includes a first fitting portion 31, a second fitting portion 32, and an intermediate portion 33 located between the first fitting portion 31 and the second fitting portion 32. In the illustrated embodiment of the present disclosure, the first fitting portion 31 is exposed in the first accommodating hole 102 to be electrically connected to a first element (not shown). The second fitting portion 32 is exposed in the second accommodating hole 103 to be electrically connected with a second element (not shown). The first element includes but not limited to a first cable or a first connector. The second element includes but not limited to a second cable, a second connector or a circuit board. In the illustrated embodiment of the present disclosure, the first fitting portion 31 is provided with a first insertion hole 311, and the first insertion hole 311 is configured to receive a conductive terminal of the first connector. The second fitting portion 32 is configured to abut against a conductive pad (not shown) on the circuit board to realize electrical connection. The central conductive terminal 30 is configured to transmit signals. In an embodiment of the present disclosure, the central conductive terminal 30 is configured to transmit signals after mating with the first element (for example, the first connector).

In one embodiment of the present disclosure, the first insertion hole 311 is a circular hole with a diameter less than or equal to 2.8 mm (for example, 2.8 mm, 1.85 mm or 1.0 mm, etc.). Besides, the electrical connector 100 of the present disclosure is configured to transmit high frequency signals. In an embodiment of the present disclosure, the electrical connector 100 is configured to transmit signals with a frequency greater than or equal to 40 GHZ.

When a signal is transmitted in the first fitting portion 31, it encounters an impedance having a first impedance value R1. When the signal is transmitted in the second fitting portion 32, it encounters an impedance having a second impedance value R2. The intermediate portion 33 includes an impedance transition area 331. When the signal is transmitted in the impedance transition area 331, it encounters an impedance having a gradually changing third impedance value R3. The first impedance value R1 is different from the second impedance value R2. The first impedance value R1, the third impedance value R3 and the second impedance value R2 generally change continuously. Preferably, the first impedance value R1, the third impedance value R3 and the second impedance value R2 generally change linearly or change smoothly. The first impedance value R1 is greater than the second impedance value R2, or the first impedance value R1 is smaller than the second impedance value R2. The difference between the first impedance value R1 and the second impedance value R2 is greater than or equal to 3Ω. In an embodiment of the present disclosure, the first impedance value R1 and the second impedance value R2 are fixed values, respectively. Of course, it is understandable to those skilled in the art that in practice, tolerances are unavoidable, so any value within a reasonable engineering error range is regarded as the "fixed value". For example, in an embodiment of the present disclosure, the first impedance value R1 is 50Ω, the second impedance value R2 is greater than or equal to 42.5Ω, and less than or equal to 45Ω. Of course, it is understandable to those skilled in the art that the first impedance value R1 and the second impedance value R2 can also be set to other values, which will not be repeated in the present disclosure.

In the illustrated embodiment of the present disclosure, the intermediate portion 33 includes a first impedance area 332 connecting the first fitting portion 31 and the impedance transition area 331, and a second impedance area 333 connecting the second fitting portion 32 and the impedance transition area 331. When the signal is transmitted in the first impedance area 332 and the first fitting portion 31, it encounters an impedance having a same first impedance value R1. When the signal is transmitted in the second impedance area 333 and the second fitting portion 32, it encounters an impedance having a same second impedance value R2. In the embodiment shown in the present disclosure, the first impedance area 332, the impedance transition area 331 and the second impedance area 333 are located in the first mounting hole 111, the central hole 131 and the second mounting hole 121 of the insulating element 20, respectively. The insulating element 20 can not only adjust the impedance of the intermediate portion 33, but also can fix the central conductive terminal 30 in the outer shell 10. In the illustrated embodiment of the present disclosure, the inner surface 132 matches the outer tapered surface 231 of the cone portion 23.

Referring to FIG. 7, along the axial direction, the first impedance area 332 has a first length L1, the second impedance area 333 has a second length L2, and the impedance transition area 331 has a third length L3. In the illustrated embodiment of the present disclosure, the first length L1 is approximately equal to the second length L2, and the second length L2 is approximately equal to the third length L3. In this way, with the help of the first impedance area 332 and the second impedance area 333, a relatively stable holding of the central conductive terminal 30 can be achieved.

In addition, the inventors also found that, when the intermediate portion 33 is within a certain length range, the longer the third length L3 of the impedance transition area 331 is, the more favorable it is to realize the objective of smooth impedance transition of the present disclosure. In an embodiment of the present disclosure, both the first length L1 and the second length L2 are 0, that is, the first impedance area 332 and the second impedance area 333 are not provided. Under the condition that the length of the intermediate portion 33 is constant, the impedance transition area 331 has a maximum adjusted length at this time. This is beneficial to make the transition of the impedance transition area 331 smoother, reducing signal mutation.

In the illustrated embodiment of the present disclosure, the first impedance area 332, the impedance transition area 331 and the second impedance area 333 have a same thickness, so as to facilitate the manufacture of the central conductive terminal 30. In the radial direction, the first impedance area 332 corresponds to the first cylindrical portion 21 and the first shell portion 11; the second impedance area 333 corresponds to the second cylindrical portion 22 and the second shell portion 12; and the impedance transition area 331 corresponds to the cone portion 23 and the third shell portion 13.

It is understandable to those skilled in the art that in a circuit with resistance, inductance and capacitance, the resistance to the current in the circuit is called impedance. The impedance of the central conductive terminal 30 is mainly related to the following factors: (a) the central conductive terminal 30 itself; (b) the impedance adjustment medium located outside the central conductive terminal 30 (for example, the insulating element 20); and (c) the outer shell 10 located outside the impedance adjustment medium.

In the first embodiment shown in the present disclosure, by optimizing the design of the insulating element 20 and the outer shell 10 (for example, the third shell portion 13), a smooth transition from the first impedance value R1 of the first fitting portion 31 to the second impedance value R2 of the second fitting portion 32 is achieved, which reduces the loss of signals during transmission and is beneficial to the accuracy of testing.

FIGS. 8 to 13 disclose a second embodiment of the electrical connector 100 of the present disclosure. The electrical connector 100 in the second embodiment includes an outer shell 10, an insulating element 20 and a central conductive terminal 30. The outer shell 10 includes a mounting hole 101. The insulating element 20 is at least partially accommodated in the mounting hole 101. At least part of the outer shell 10 is a metal shell to achieve grounding.

The main differences between the electrical connector 100 in the second embodiment and the electrical connector 100 in the first embodiment will be described below, and for the same or similar parts, please refer to the description in the first embodiment.

Figure 12:
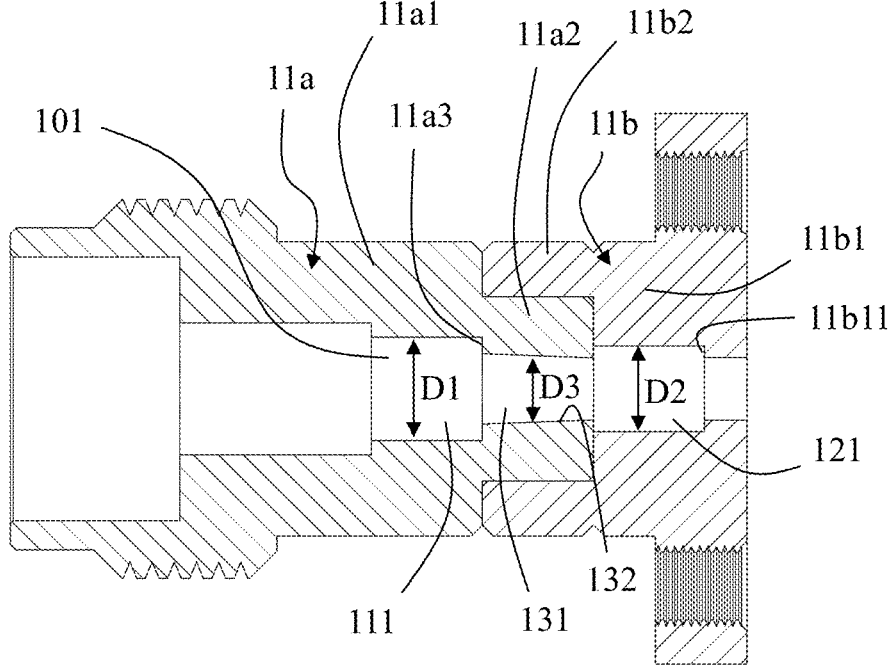
FIG. 12 is a schematic cross-sectional view taken along line A3-A3 in FIG. 8, wherein the first insulating element, the second insulating element and the central conductive terminal are not shown.
Figure 13:
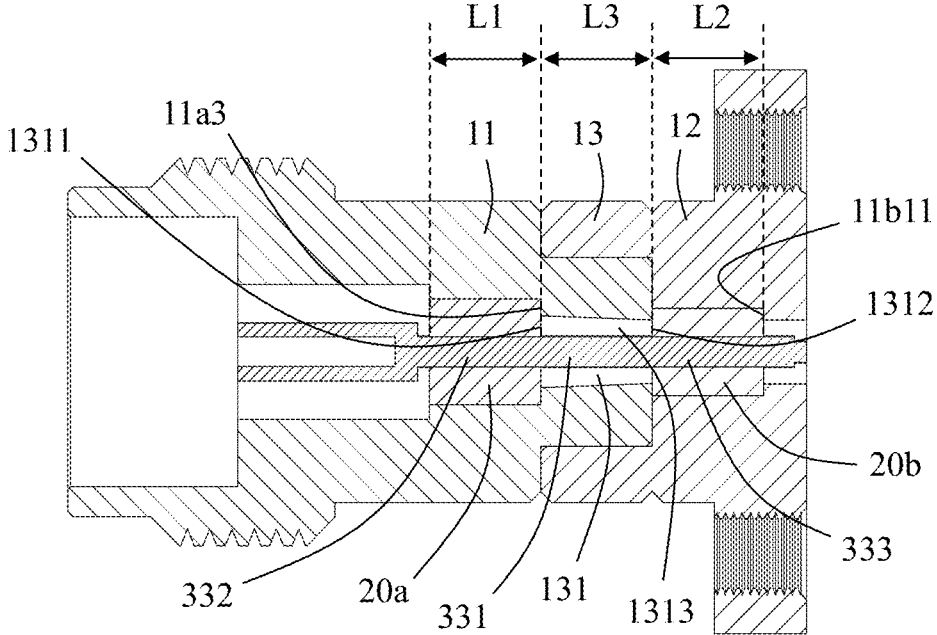
FIG. 13 is a schematic sectional view taken along line A3-A3 in FIG. 8.
Figure 14:
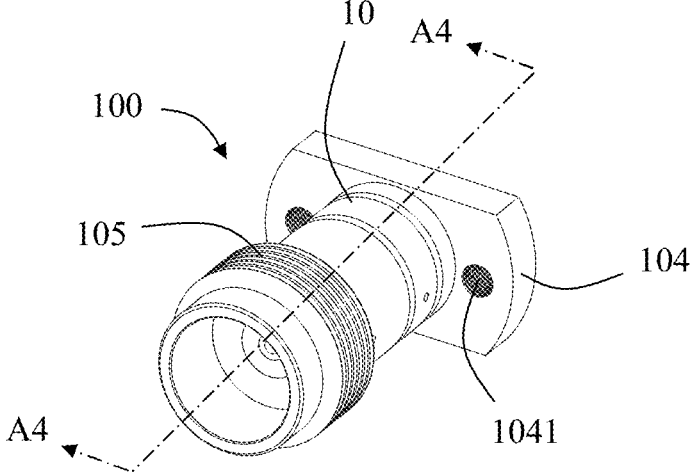
FIG. 14 is a schematic perspective view of an electrical connector in accordance with a third embodiment of the present disclosure.
Figure 15:
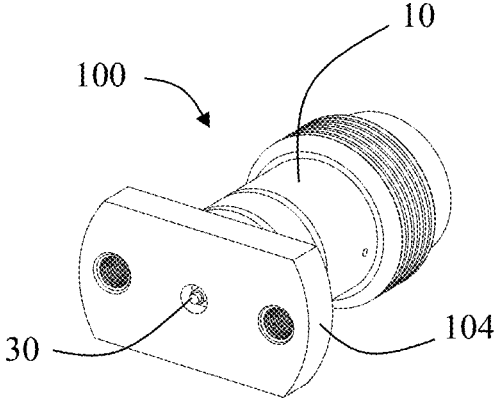
FIG. 15 is a schematic perspective view of FIG. 14 from another angle.

Referring to FIG. 12 and FIG. 13, in the second embodiment, the outer shell 10 includes a first shell 11a and a second shell 11b fixed to the first shell 11a. The first shell 11a is made separately from the second shell 11b, and assembled and fixed together. In the illustrated embodiment of the present disclosure, both the first shell 11a and second shell 11b are metal shells in order to improve the grounding effect. The first shell 11a includes a first base portion 11a1 and a first extension portion 11a2 extending from the first base portion 11*al* along the axial direction. The first base portion 11*al* defines a first mounting hole 111. The first extension portion 11*a*2 defines a central hole 131. The second shell 11*b* includes a second base portion 11*b*1 and a second extension portion 11*b*2 extending from the second base portion 11*b*1 along the axial direction. The second base portion 11*b*1 defines a second mounting hole 121. The second extension portion 11*b*2 defines a first receiving hole 11*b*21 (see FIG. 9) for receiving the first extension portion 11*a*2. In the illustrated embodiment of the present disclosure, the first extension portion 11*a*2 is fixed in the first receiving hole 11*b*21 of the second extension portion 11*b*2, and the fastening methods include but are not limited to screw threads, bolts, adhesion and other methods.

In the second embodiment, the first shell portion 11 is provided on the first base portion 11*al*. The second shell portion 12 is disposed on the second base portion 11*b*1. The third shell portion 13 includes the first extension portion 11*a*2 and the second extension portion 11*b*2 located outside the first extension portion 11*a*2.

A diameter of the first mounting hole 111 is larger than that of the central hole 131, so as to form a first stepped surface 11*a*3 at a junction of the first mounting hole 111 and the central hole 131. A diameter of the second mounting hole 121 is larger than that of the central hole 131. The second base portion 11*b*1 has a second stepped surface 11*b*11 exposed in the second mounting hole 121.

In the illustrated embodiment of the present disclosure, the first mounting hole 111 is a cylindrical hole, the second mounting hole 121 is a cylindrical hole, and the central hole 131 is a tapered hole. The mounting hole 101 includes the first mounting hole 111, the central hole 131 and the second mounting hole 121. The first mounting hole 111 communicates with the second mounting hole 121 through the central hole 131. The first mounting hole 111, the central hole 131 and the second mounting hole 121 are coaxially arranged.

In the illustrated embodiment of the present disclosure, the first mounting hole 111 has a first diameter D1, the second mounting hole 121 has a second diameter D2, and the central hole 131 has a gradually changing third diameter D3. The central hole 131 includes a first end portion 1311 adjacent to the first mounting hole 111 and a second end portion 1312 adjacent to the second mounting hole 121. The central hole 131 has a same first diameter D1 at the first end portion 1311 as the first mounting hole 111. The central hole 131 has a same second diameter D2 at the second end portion 1312 as the second mounting hole 121. The third diameter D3 is configured to gradually transition from the first diameter D1 to the second diameter D2. In other words, the inner surface 132 changes continuously from the first end portion 1311 to the second end portion 1312. Preferably, the inner surface 132 changes linearly or smoothly from the first end portion 1311 to the second end portion 1312.

Referring to FIG. 9 to FIG. 13, the insulating element 20 includes a first insulating element 20*a* accommodated in the first mounting hole 111 and a second insulating element 20*b* accommodated in the second mounting hole 121. The first stepped surface 11*a*3 is configured to limit the first insulating element 20*a*. The second stepped surface 11*b*11 is configured to limit the second insulating element 20*b*. The first extension portion 11*a*2 abuts against the second insulating element 20*b* along the axial direction, so that the second insulating element 20*b* can be stably held in the second mounting hole 121 along the axial direction.

The first insulating element 20*a* defines a first through hole 20*al* extending through the first insulating element 20*a* along the axial direction. The second insulating element 20*b* defines a second through hole 20*b*1 extending through the second insulating element 20*b* along the axial direction. The central conductive terminal 30 extends through the first through hole 20*al* and the second through hole 20*b*1. The through hole 201 includes the first through hole 20*al* and the second through hole 20*b*1.

Figure 9:
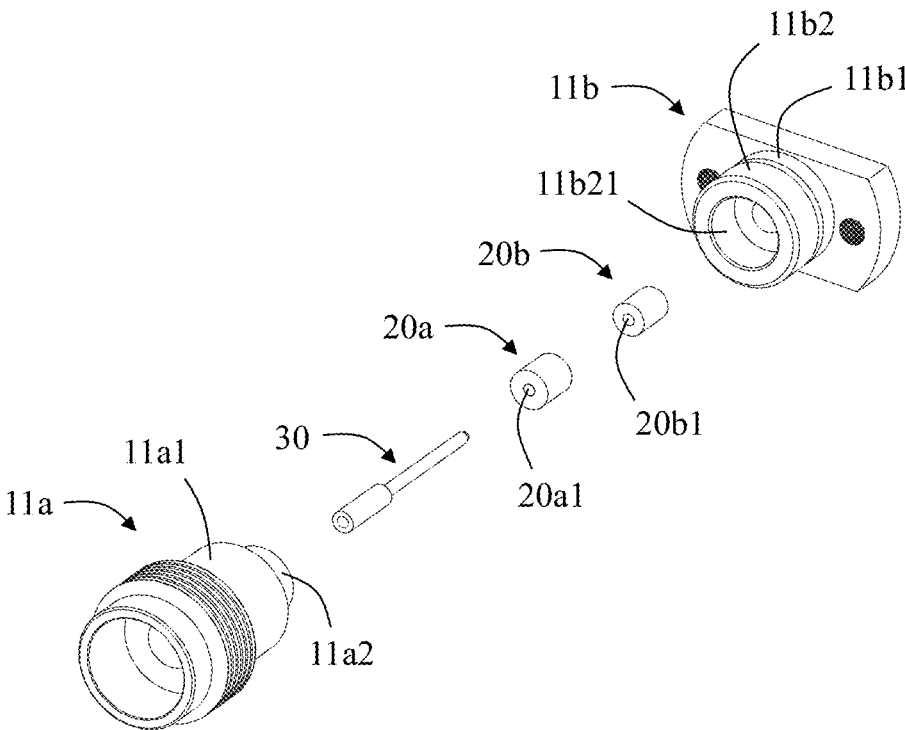
FIG. 9 is a perspective exploded view of FIG. 8.
Figure 10:
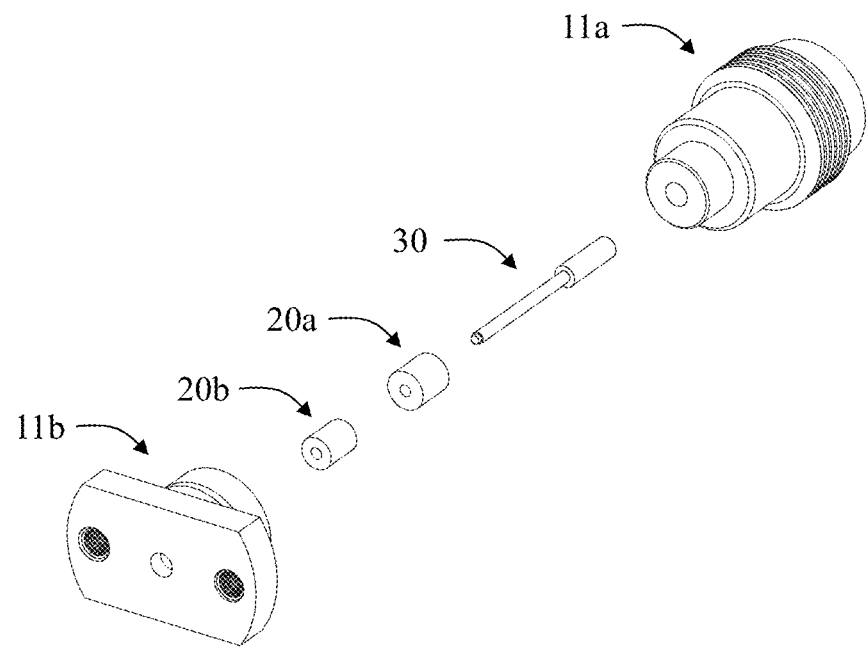
FIG. 10 is a perspective exploded view of FIG. 9 from another angle.
Figure 11:
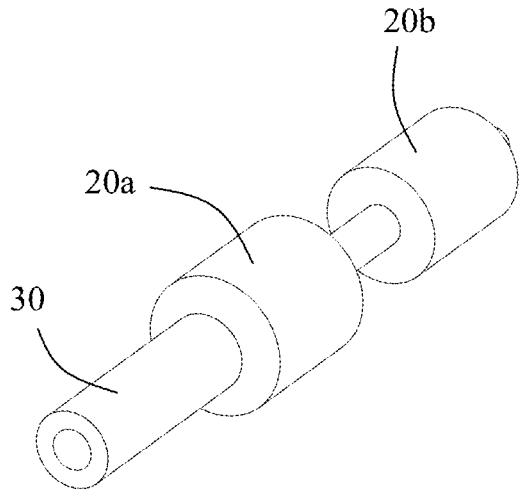
FIG. 11 is a schematic perspective view of a first insulating element, a second insulating element and a central conductive terminal when they are mated.

Referring to FIG. 9 and FIG. 13, the first impedance area 332 is located in the first through hole 20*al*, the second impedance area 333 is located in the second through hole 20*b*1, and the impedance transition area 331 is located in the central hole 131.

In the illustrated embodiment of the present disclosure, the impedance transition area 331 is not in contact with the first extension portion 11*a*2. The central hole 131 has an impedance adjustment medium radially surrounding an outside of the impedance transition area 331. The impedance adjustment medium is a dielectric material. In the illustrated embodiment of the present disclosure, the dielectric material is air. Of course, in other embodiments, the impedance adjustment medium may also be made of other materials. The outer shell 10 includes an impedance transition hole 1313 and an inner surface 132 exposed in the impedance transition hole 1313. The impedance transition hole 1313 corresponds to the impedance transition area 331. The inner surface 132 changes continuously. After the central conductive terminal 30 passes through the central hole 131, the impedance transition area 331 is located in the impedance transition hole 1313. A portion of the impedance transition hole 1313 between the inner surface 132 of the outer shell 10 and the outer surface of the impedance transition area 331 is filled with air.

In the second embodiment of the electrical connector 100 of the present disclosure, an assembly method is as follows: firstly, the central conductive terminal 30 is passed through the first through hole 20*al* of the first insulating element 20*a*. Then, the first insulating element 20*a* and the central conductive terminal 30 are integrally assembled into the first shell 11*a*. Then, the second insulating element 20*b* is axially sleeved on the central conductive terminal 30. Finally, it is assembled with the second shell 11*b*.

Another assembly method is as follows: firstly, the first insulating element 20*a* is installed into the first mounting hole 111, and the second insulating element 20*b* is installed into the second mounting hole 121. Then, the first shell 11*a* is assembled with the second shell 11*b*. Finally, the central conductive terminal 30 is inserted.

Of course, it is understandable to those skilled in the art that the electrical connector 100 in the second embodiment of the present disclosure can also be assembled by other methods, which will not be repeated in the present disclosure.

FIGS. 14 to 18 disclose a third embodiment of the electrical connector 100 of the present disclosure. The electrical connector 100 in the third embodiment includes an outer shell 10, an insulating element 20 and a central conductive terminal 30. The outer shell 10 includes a mounting hole 101. The insulating element 20 is at least partially accommodated in the mounting hole 101. At least part of the outer shell 10 is a metal shell to achieve grounding.

The main differences between the electrical connector 100 in the third embodiment and the electrical connector 100 in the second embodiment will be described below. For the same or similar parts, please refer to the descriptions in the first embodiment and the second embodiment.

In the third embodiment, the outer shell 10 includes a first shell 11*a*, a second shell 11*b* fixed to the first shell 11*a*, and a third shell 11c fixed to the first shell 11a. The second shell 11b and the third shell 11c are connected to two ends of the first shell 11a, respectively. In one embodiment of the present disclosure, the first shell 11a includes a plastic shell portion and a metal layer attached to an inner side and/or an outer side of the plastic shell portion. The second shell 11b and the third shell 11c are metal shells. The metal layer connects the second shell 11b and the third shell 11c together to achieve better grounding. Of course, it is understandable to those skilled in the art that the first shell 11a, the second shell 11b and the third shell 11c can also use other material configurations to achieve a smooth impedance transition.

Figure 16:
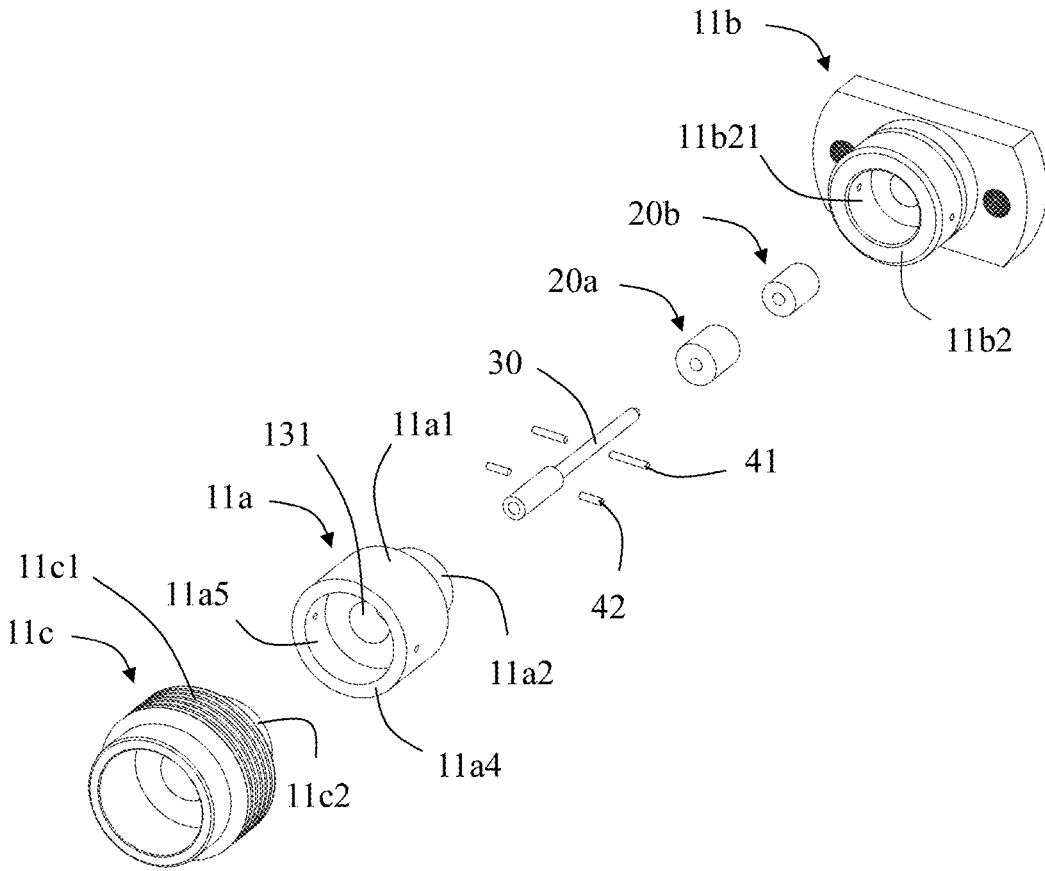
FIG. 16 is a perspective exploded view of FIG. 14.
Figure 17:
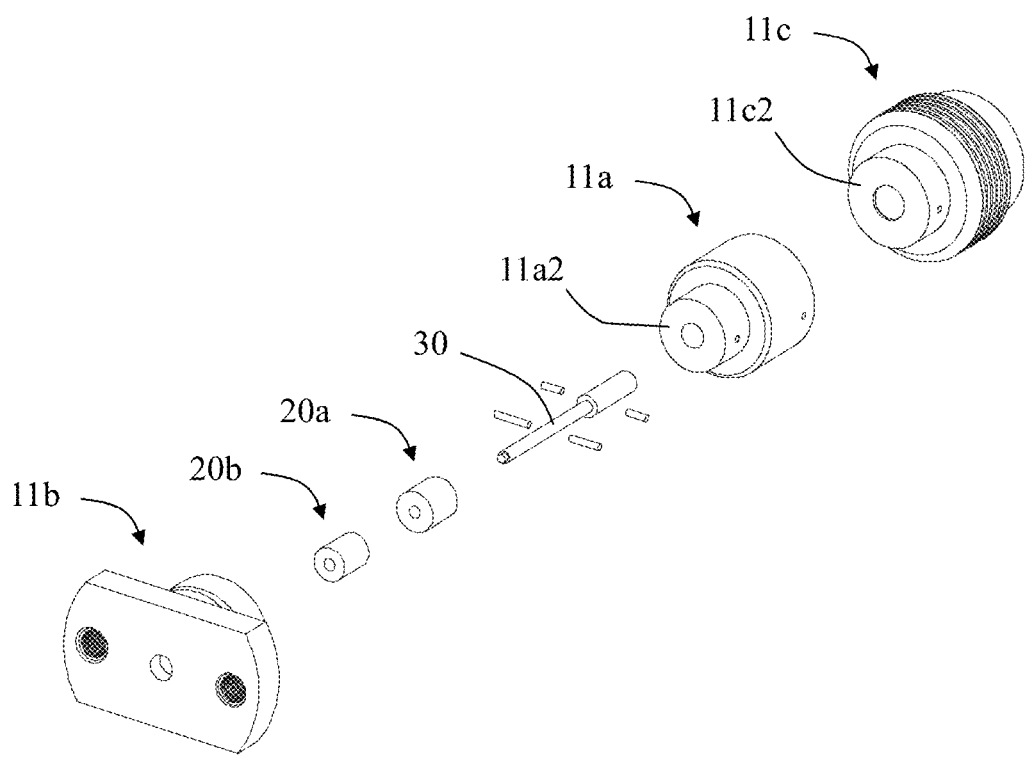
FIG. 17 is a perspective exploded view of FIG. 16 from another angle.
Figure 18:
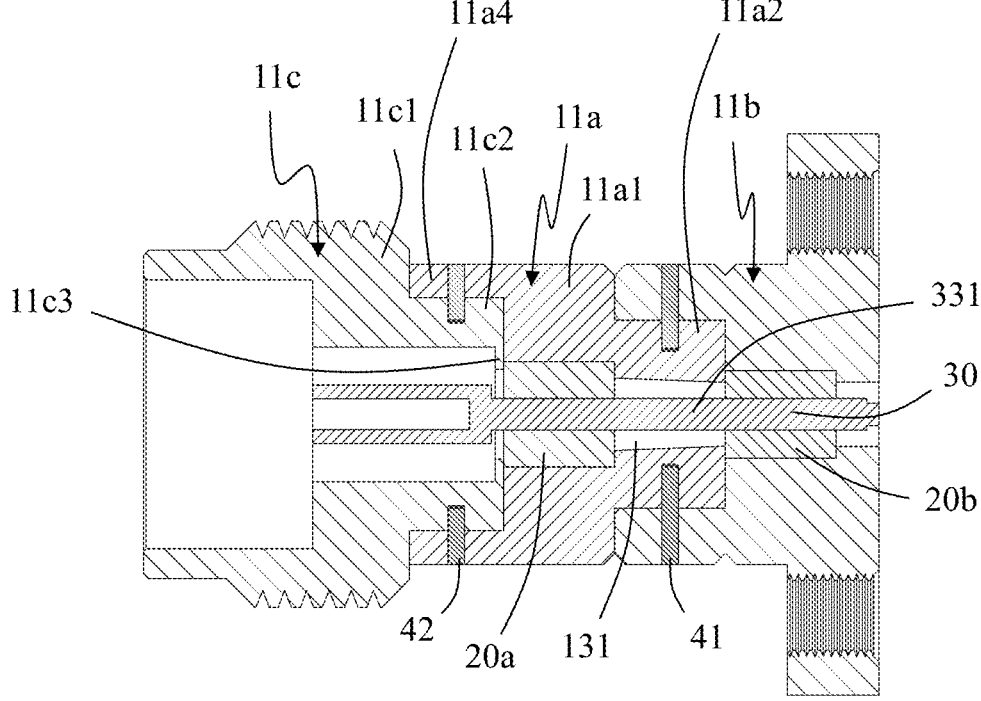
FIG. 18 is a schematic sectional view taken along line A4-A4 in FIG. 14.

Referring to FIG. 16 to FIG. 18, the first shell 11a is provided with a first base portion 11al, a first extension portion 11a2 extending from the first base portion 11al in the axial direction, and a cylinder portion 11a4 extending from the first base portion 11al in the axial direction. The first extension portion 11a2 and the cylinder portion 11a4 are located on two sides of the first base portion 11a1, respectively. The first base portion 11a1 defines a first mounting hole 111. The first extension portion 11a2 defines a central hole 131. The cylinder portion 11a4 defines a second receiving hole 11a5 (see FIG. 16). The second shell 11b includes a second base portion 11b1 and a second extension portion 11b2 extending from the second base portion 11b1 along the axial direction. The second base portion 11b1 defines a second mounting hole 121. The second extension portion 11b2 defines a first receiving hole 11b21 for receiving the first extension portion 11a2. In the illustrated embodiment of the present disclosure, the first extension portion 11a2 is fixed in the first receiving hole 11b21 of the second extension portion 11b2.

The third shell 11c includes a third base portion 11c1 and a third extension portion 11c2 extending from the third base portion 11c1 along the axial direction. The third extension portion 11c2 is received and fixed in the second receiving hole 11a5. The third extension portion 11c2 abuts against the first insulating element 20a along the axial direction, so that the first insulating element 20a can be stably fixed in the first mounting hole 111. Specifically, the third extension portion 11c2 is provided with a baffle plate 11c3 protruding radially toward the first accommodating hole 102. The baffle plate 11c3 abuts against the first insulating element 20a along the axial direction, so that the first insulating element 20a can be stably fixed in the first mounting hole 111.

The electrical connector 100 includes a first fastening element 41 inserted into the first shell 11a and the second shell 11b to fix the first shell 11a and the second shell 11b, and a second fastening element 42 inserted into the first shell 11a and the third shell 11c to fix the first shell 11a and the third shell 11c. In the illustrated embodiment of the present disclosure, both the first fastening element 41 and the second fastening element 42 are pins. Specifically, the first fastening element 41 is inserted into the first extension portion 11a2 and the second extension portion 11b2 to fix the first shell 11a and the second shell 11b. The second fastening element 42 is inserted into the cylinder portion 11a4 and the third extension portion 11c2 to fix the first shell 11a and the third shell 11c.

Of course, it is understandable to those skilled in the art that the fastening method of the first shell 11a and the second shell 11b, and the fastening method of the first shell 11a and the third shell 11c can also be realized by means of threading or adhesion etc., which will not be repeated in the present disclosure.

In the third embodiment of the electrical connector 100 of the present disclosure, an assembly method is as follows:

firstly, the first insulating element 20a is installed into the first mounting hole 111, and the second insulating element 20b is installed into the second mounting hole 121. Then, the first shell 11a is assembled with the second shell 11b. Then, the first shell 11a is assembled with the third shell 11c. Then, the first fastening element 41 and the second fastening element 42 are inserted to fix the first shell 11a and the second shell 11b, and fix the first shell 11a and the third shell 11c. Finally, the central conductive terminal 30 is inserted.

Of course, it is understandable to those skilled in the art that the electrical connector 100 in the third embodiment of the present disclosure can also be assembled by other methods, which will not be repeated in the present disclosure.

Figure 19:
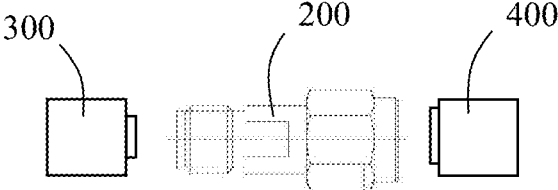
FIG. 19 is a schematic diagram of an adapter, a first electrical element, and a second electrical element in accordance with an embodiment of the present disclosure.

Referring to FIG. 19, the present disclosure also discloses an adapter 200 configured to electrically connect the first electrical element 300 and the second electrical element 400. The adapter 200 includes the aforementioned electrical connector 100. One end of the electrical connector 100 is electrically connected to the first electrical element 300, and the other end of the electrical connector 100 is electrically connected to the second electrical element 400. In an embodiment of the present disclosure, the first electrical element 300 is a first connector, and the second electrical element 400 is a second connector. The first connector may be a male connector or a female connector. The second connector may also be a male connector or a female connector. The adapter 200 is capable of realizing the transition between various types of connectors.

Figure 20:
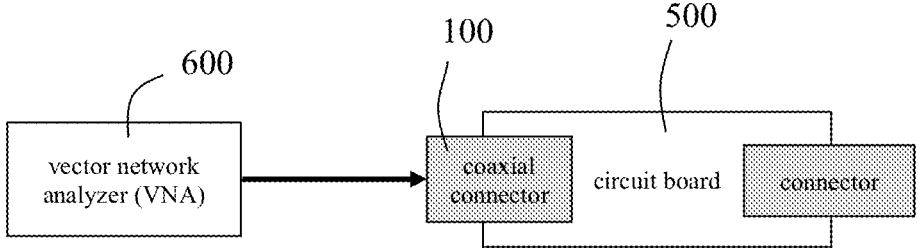
FIG. 20 is a schematic diagram of a test device in accordance with an embodiment of the present disclosure.

Referring to FIG. 20, besides, the present disclosure also discloses a test device, which includes a circuit board 500, the aforementioned electrical connector 100, and a vector network analyzer 600. The electrical connector 100 is electrically connected to the circuit board 500. The vector network analyzer 600 is electrically connected to the circuit board 500 through the electrical connector 100 and a cable (not shown). The circuit board 500 is configured to be electrically connected with a connector to be tested. With such arrangement, the performance of the connector to be tested can be tested by the test device.

Compared with the prior art, the present disclosure is provided with the impedance transition area 331, and the impedance transition area 331 includes a gradually changing third impedance value R3, thereby realizing a smooth transition from the first impedance value R1 to the second impedance value R2.

The above embodiments are only used to illustrate the present disclosure and not to limit the technical solutions described in the present disclosure. The understanding of this specification should be based on those skilled in the art. Descriptions of directions, although they have been described in detail in the above-mentioned embodiments of the present disclosure, those skilled in the art should understand that modifications or equivalent substitutions can still be made to the application, and all technical solutions and improvements that do not depart from the spirit and scope of the application should be covered by the claims of the application.

What is claimed is:

1. An electrical connector, comprising:
   an outer shell defining a mounting hole, at least part of the outer shell being a metal shell;
   an insulating element installed in the mounting hole, the insulating element defining a through hole extending in an axial direction; and
   a central conductive terminal inserted into and at least partially extending through the through hole, the central conductive terminal comprising a first fitting portion, a second fitting portion, and an intermediate portion located between the first fitting portion and the second fitting portion; the central conductive terminal being configured to transmit a signal;

when the signal is transmitted in the first fitting portion, it encounters an impedance having a first impedance value; when the signal is transmitted in the second fitting portion, it encounters an impedance having a second impedance value; the intermediate portion comprises an impedance transition area, and when the signal is transmitted in the impedance transition area, it encounters an impedance having a gradually changing third impedance value;

wherein the first impedance value is different from the second impedance value; the first impedance value, the third impedance value and the second impedance value generally have a smooth transition.

2. The electrical connector according to claim 1, wherein the first impedance value, the third impedance value and the second impedance value are generally linear change or change in a smooth curve.

3. The electrical connector according to claim 2, wherein difference between the first impedance value and the second impedance value is greater than or equal to 3 Ω.

4. The electrical connector according to claim 1, wherein the outer shell comprises an impedance transition hole and an inner surface exposed in the impedance transition hole; the impedance transition hole corresponds to the impedance transition area; and the inner surface changes continuously.

5. The electrical connector according to claim 1, further comprising an impedance adjustment medium radially surrounding an outside of the impedance transition area, the impedance adjustment medium being a dielectric material which is insulating plastic, the impedance transition area comprising a first end portion adjacent to the first fitting portion and a second end portion adjacent to the second fitting portion, the insulating element comprising an outer tapered surface which changes continuously from the first end portion to the second end portion;

wherein the outer shell comprises a tapered hole for accommodating the insulating plastic and an inner surface exposed in the tapered hole, the inner surface is an inner tapered surface, and the inner surface of the outer shell matches the outer tapered surface of the insulating element; and wherein the inner surface changes continuously from the first end portion to the second end portion.

6. The electrical connector according to claim 1, further comprising an impedance adjustment medium radially surrounding an outside of the impedance transition area, the impedance adjustment medium being a dielectric material which is air, the impedance transition area comprising a first end portion adjacent to the first fitting portion and a second end portion adjacent to the second fitting portion, the outer shell comprising an impedance transition hole and an inner surface exposed in the impedance transition hole, the impedance transition hole being located between the impedance transition area and the inner surface in a radial direction, the air being at least partially located in the impedance transition hole, the inner surface changing continuously from the first end portion to the second end portion.

7. The electrical connector according to claim 1, wherein the intermediate portion comprises a first impedance area connecting the first fitting portion and the impedance transition area, and a second impedance area connecting the second fitting portion and the impedance transition area;

when the signal is transmitted in the first impedance area and the first fitting portion, it encounters an impedance having a same first impedance value; when the signal is transmitted in the second impedance area and the second fitting portion, it encounters an impedance having a same second impedance value.

8. The electrical connector according to claim 7, wherein the outer shell comprises a first shell portion, a second shell portion and a third shell portion, the first shell portion corresponds to the first impedance area in a radial direction, the second shell portion corresponds to the second impedance area in the radial direction, and the third shell portion corresponds to the impedance transition area in the radial direction.

9. The electrical connector according to claim 8, wherein the mounting hole extends through the first shell portion, the second shell portion and the third shell portion along the axial direction; the insulating element comprises a first cylindrical portion, a second cylindrical portion, and a cone portion connecting the first cylindrical portion and the second cylindrical portion; the first cylindrical portion has a first outer diameter, the second cylindrical portion has a second outer diameter, an end of the cone portion adjacent to the first cylindrical portion has a same first outer diameter as that of the first cylindrical portion, another end of the cone portion adjacent to the second cylindrical portion has a same second outer diameter as that of the second cylindrical portion, the first outer diameter is larger than the second outer diameter, and the outer diameter of the cone portion changes continuously.

10. The electrical connector according to claim 8, wherein the outer shell comprises a first shell and a second shell fixed to the first shell, the first shell comprises a first base portion and a first extension portion extending from the first base portion along the axial direction, the first base portion defines a first mounting hole, and the first extension portion defines a central hole;

wherein the second shell comprises a second base portion and a second extension portion extending from the second base portion along the axial direction, the second base portion defines a second mounting hole, the second extension portion defines a first receiving hole to receive the first extension portion; and wherein the first shell portion is provided on the first base portion, the second shell portion is provided on the second base portion, and the third shell portion comprises the first extension portion and the second extension portion.

11. The electrical connector according to claim 10, wherein the mounting hole comprises the first mounting hole and the second mounting hole; the central hole communicates with the first mounting hole and the second mounting hole; the first mounting hole, the central hole and the second mounting hole are distributed sequentially along the axial direction; the first mounting hole, the central hole and the second mounting hole are arranged coaxially; a diameter of the first mounting hole is larger than a diameter of the central hole so as to form a first stepped surface at an intersection of the first mounting hole and the central hole; a diameter of the second mounting hole is larger than the diameter of the central hole; the second base portion comprises a second stepped surface exposed in the second mounting hole;

wherein the insulating element comprises a first insulating element accommodated in the first mounting hole and a second insulating element accommodated in the second mounting hole; the first stepped surface is configured to limit the first insulating element; the second stepped surface is configured to limit the second insulating element; and the first extension portion abuts against the second insulating element along the axial direction.

12. The electrical connector according to claim 11, wherein the first insulating element defines a first through hole extending through the first insulating element along the axial direction; the second insulating element defines a second through hole extending through the second insulating element along the axial direction; the central conductive terminal extends through the first through hole and the second through hole; and the through hole comprises the first through hole and the second through hole.

13. The electrical connector according to claim 12, wherein the first impedance area is located in the first through hole; the second impedance area is located in the second through hole; and the impedance transition area is located in the central hole.

14. The electrical connector according to claim 13, wherein the impedance transition area is not in contact with the first extension portion; an impedance adjustment medium radially surrounding an outside of the impedance transition area is provided in the central hole, the impedance adjustment medium is air; the impedance transition area comprises a first end portion connected to the first impedance area and a second end portion connected to the second impedance area; the first extension portion comprises an inner surface exposed in the central hole, the inner surface is an inner tapered surface, and the inner surface changes continuously from the first end portion to the second end portion.

15. The electrical connector according to claim 14, wherein the outer shell comprises a third shell fixed to the first shell; the first shell comprises a cylinder portion extending from the first base portion along the axial direction; the first extension portion and the cylinder portion are located on two sides of the first base portion, respectively; the cylinder portion defines a second receiving hole;

wherein the third shell comprises a third base portion and a third extension portion extending from the third base portion along the axial direction; the third extension portion is accommodated in the second accommodating hole; and wherein the third extension portion abuts against the first insulating element along the axial direction.

16. The electrical connector according to claim 15, further comprising a first fastening element inserted into the first shell and the second shell so as to fix the first shell and the second shell; and a second fastening element inserted into the first shell and the third shell so as to fix the first shell and the third shell.

17. The electrical connector according to claim 1, wherein the electrical connector is a coaxial connector; the outer shell comprises a first accommodating hole and a second accommodating hole; the first fitting portion is exposed in the first accommodating hole; and the second fitting portion is exposed in the second accommodating hole.

18. An adapter, configured to electrically connect a first electrical element with a second electrical element, comprising an electrical connector, the electrical connector comprising:

an outer shell defining a mounting hole, at least part of the outer shell being a metal shell;

an insulating element installed in the mounting hole, the insulating element defining a through hole extending in an axial direction; and a central conductive terminal inserted into and at least partially extending through the through hole, the central conductive terminal comprising a first fitting portion, a second fitting portion, and an intermediate portion located between the first fitting portion and the second fitting portion; the central conductive terminal being configured to transmit a signal;

when the signal is transmitted in the first fitting portion, it encounters an impedance having a first impedance value; when the signal is transmitted in the second fitting portion, it encounters an impedance having a second impedance value; the intermediate portion comprises an impedance transition area, and when the signal is transmitted in the impedance transition area, it encounters an impedance having a gradually changing third impedance value;

wherein the first impedance value is different from the second impedance value; the first impedance value, the third impedance value and the second impedance value generally have a smooth transition;

wherein one end of the electrical connector is electrically connected to the first electrical element, and another end of the electrical connector is electrically connected to the second electrical element.

19. The adapter according to claim 18, wherein the first electrical element is a first connector, and the second electrical element is a second connector.

* * * * *